United States Patent

Burgyan

[11] 4,056,685
[45] Nov. 1, 1977

[54] SIGNAL DISTRIBUTING AND MUTING SYSTEM FOR MULTIPLE CHANNEL FM STEREO SYSTEM

[75] Inventor: Lajos Burgyan, Chicago, Ill.

[73] Assignee: Zenith Radio Corporation, Glenview, Ill.

[21] Appl. No.: 755,367

[22] Filed: Dec. 29, 1976

[51] Int. Cl.$^2$ .............................................. H04H 5/00
[52] U.S. Cl. ...................... 179/15 BT; 179/100.1 TD
[58] Field of Search .............. 179/15 BT, 1 GQ, 1 G, 179/100.1 TD, 100.4 ST; 325/36, 492

[56] References Cited

U.S. PATENT DOCUMENTS

| | | | |
|---|---|---|---|
| 3,934,092 | 1/1976 | Csicsatka | 179/15 BT |
| 3,944,747 | 3/1976 | Eilers | 179/15 BT |
| 3,965,302 | 6/1976 | Kurata | 179/15 BT |
| 4,016,366 | 4/1977 | Kurata | 179/15 BT |

*Primary Examiner*—Douglas W. Olms
*Attorney, Agent, or Firm*—Cornelius J. O'Connor

[57] ABSTRACT

A signal distributing and muting system for a four-channel stereo receiver comprises a source of composite baseband signal, a source of bias potential and a plurality of differential amplifier type demodulators for developing a like plurality of audio difference components. The system includes a composite signal distributor having a first output terminal for applying composite signal to one of the demodulators and a second output terminal for applying composite signal for the remaining ones of the demodulators. A bias potential distributor has a first output terminal for applying operating bias to one demodulator and a second output terminal for applying operating bias to the remaining ones of the demodulators. A control signal is provided which has a first amplitude indicative of detection by the receiver of a four-channel pilot signal and a second different amplitude indicative of failure to detect such a pilot signal. A switch coupled to the second output terminals of the composite signal and bias potential distributors responds to a control signal of said first amplitude to render the remaining demodulators operative. In response to a control signal of a different amplitude the switch renders the remaining demodulators quiescent while simultaneously controlling the bias applied to these demodulators so that the power consumed by their differential amplifiers during the quiescent condition remain substantially the same as the power consumed during the operative condition.

5 Claims, 5 Drawing Figures

COMPOSITE BASEBAND SPECTRUM

SIGNAL DISTRIBUTING AND MUTING SYSTEM FOR MULTIPLE CHANNEL FM STEREO SYSTEM

CROSS-REFERENCE TO RELATED PATENTS

This application discloses subject matter which relates to subject matter disclosed in U.S. Pat. No. 3,944,747 which issued to Carl G. Eilers as well as to subject matter disclosed in U.S. Pat. No. 3,902,018 which issued to Peter Fockens. Additionally, the subject matter of this application relates to subject matter disclosed in copending application Ser. No. 643,962 now U.S. Pat. No. 4,027,107 which was filed Dec. 24, 1975 in the name of Carl G. Eilers and copending application Ser. No. 729,510 which was filed Oct. 4, 1976 in the name of Dirk de Weger. The aforementioned patents and patent applications are assigned to the assignee of this application.

BACKGROUND OF THE INVENTION

The present invention relates to a signal distributing and muting system for use in a multiple channel frequency modulation stereo receiver. More particularly, the invention pertains to a composite signal and bias potential distributing arrangement for switching the receiver's demodulator circuitry between operative and quiescent conditions in response to a control signal while simultaneously muting the receiver during such switchover.

Present-day broadcast FM stereo features the transmission of a two-channel coherent stereo signal, the demodulation function of which may be represented as follows:

$$M'(t) = K'(L+R) = K''(L-R)\sin \omega_s t, \quad (1)$$

where $L$ represents a left side audio signal, $R$ represents a right side audio signal, $\omega_s$ is the radian frequency of a suppressed carrier amplitude modulated subcarrier signal, $t$ is time and $K'$ and $K''$ are constants. A two-channel stereo receiver responds to a stereo broadcast by demodulating the sum and difference audio terms and then matrixes those two terms in order to yield the fundamental left and right audio signals $L$ and $R$. This same receiver responds to a monaural FM broadcast by reproducing the same monaural audio signal in both of its output channels.

On the other hand, a monaural FM receiver responds to a two-channel broadcast stereo signal by deriving only the sum term $(L+R)$ represented in equation (1) to reproduce an audio signal representative of the monaural program. The two-channel signal thus is fully compatible with the monaural signal so that a receiver properly designed for one will also receive the other. Further detailed discussion of the foregoing two-channel transmission system and exemplary disclosures of transmitters and receivers for use therewith will be found in the following U.S. Pat. Nos.: 3,257,511—Adler et al.; 3,257,512—Eilers; 3,129,288—DeVries; and 3,151,218—Dias et al., all of which patents are assigned to the same assignee as the present invention.

In the last few years, interest has been evidenced in recording systems wherein a four-channel, or quadraphonic, stereo signal is recorded on magentic tape. The four different audio signals represent sources respectively located at the left front, right front, left rear and right rear of an originating point. By using four similarly located pick-ups to effect a four-channel recording and then, subsequently, utilizing a playback arrangement having four separate loud speakers similarly distributed around a listening point, a four-channel reproduction is obtained.

The advent of four-channel stereo recording and reproduction has naturally led to consideration of the desirability of transmitting and receiving four-channel stereo signals by radio. Because two-channel stereo is now being broadcast by many FM transmitting stations, attention has been directed particularly to the possibility of utilizing broadcast stations in that category of service for the transmission of four-channel stereo in addition to, or instead of, the transmission of two-channel stereo or monaural signals. To accomplish such a transmission a complex composite baseband signal must be developed in order to accommodate the additional signal components necessary to convey four separate channels of information. At the same time, it is desirable that any four-channel approach be fully compatible with present two-channel stereo and monaural, so that receiver obsolescence is avoided.

It is also desirable from the standpoint of broadcast station economics, that a commercial four-channel stereo system include provision for an SCA (Subsidiary Communications Authorization) channel. The above mentioned U.S. Pat. No. 3,944,747 of Eilers, as well as U.S. Pat. No. 3,902,018 of Fockens, describe four-channel compatible FM stereo systems capable of accommodating SCA.

In a four-channel stereo system of the type herein contemplated (and more fully described below), the composite baseband signal comprises a main audio signal and three modulated subcarriers. This composite baseband signal, in turn, is employed to frequency modulate an RF carrier. Subsequent to initial detection in the receiver, the baseband signal is demodulated by three differential amplifier type demodulators; one of which detects the sum component and the $\pm$ Y difference signals, another detects the $\pm$ X difference signals while the third detects the $\pm$ U diagonal difference signals.

However, when a four-channel transmission is interrupted or terminated, the X and U demodulators become non-functional, thereby precipitating a muting problem. In the absence of any muting provision, audible noise is contributed to the audio output reproducers by the non-functional demodulators. The prior art resolves this problem by resort to circuitry that decouples the switching subcarrier signal from the non-functional demodulators. However, while a measure of silent muting is now achieved, the composite baseband signal is still translated by the non-functional demodulators which occasions a deterioration in channel separation on two-channel stereo programs.

OBJECTS OF THE INVENTION

It is therefore a general object of the invention to provide an improved signal distributing and muting system for a multiple channel FM stereo receiver.

It is a specific object of the invention to provide a composite baseband signal and bias potential distributing arrangement which affords silent muting of a multiple channel stereo receiver in the absence of a quadraphonic stereo signal without adversely affecting two-channel stereo separation.

SUMMARY OF THE INVENTION

A signal distributing and muting system for a multiple channel stereo receiver is described. This system comprises a source of composite baseband signal, a source of bias potential and a plurality of differential amplifier type demodulators responsive to the composite baseband signal and to the source of bias potential for developing a like plurality of audio difference components. The system futher includes a composite signal distributor having an input terminal coupled to the source of composite baseband signal, a first output terminal for applying the composite signal to one of the demodulators and a second output terminal for applying the composite signal to the other ones of the demodulators. Also included is a bias potential distributor connected to the source of bias potential and having a first output terminal for applying operating bias potential to the foresaid one demodulator and a second output terminal for applying operating bias potential to the other ones of the demodulators. A source of control signal is also provided, which signal has a predetermined first amplitude indicative of detection by the receiver of a multiple-channel related pilot signal and having a predetermined different amplitude indicative of failure to detect such pilot signal. Finally, switch means are coupled across the second output terminals of the composite signal distributor and the bias potential distributor to respond to a control signal of said predetermined first amplitude to establish a coupling between the second output terminals and the other demodulators to render such other demodulators operative. The switch means also responds to a control signal of said predetermined different amplitude to render the other demodulators quiescent by effectively decoupling the composite signal from the other demodulators while simultaneously so controlling the bias potentials applied concurrently to each of the other demodulator differential amplifiers, that the power consumed by these other differential amplifiers during their quiescent condition remains substantially the same as the power consumed by them during their operative condition.

BRIEF DESCRIPTION OF THE DRAWINGS

The features of the present invention which are believed to be novel are set forth with particularity in the appended claims. The organization and manner of operation of the invention, together with further objects and advantages thereof, may best be understood by reference to the following description taken in conjunction with the accompanying figures, in the several figures of which like reference numerals identify like elements, and in which:

DESCRIPTION OF THE PREFERRED EMBODIMENT

Figure 1:
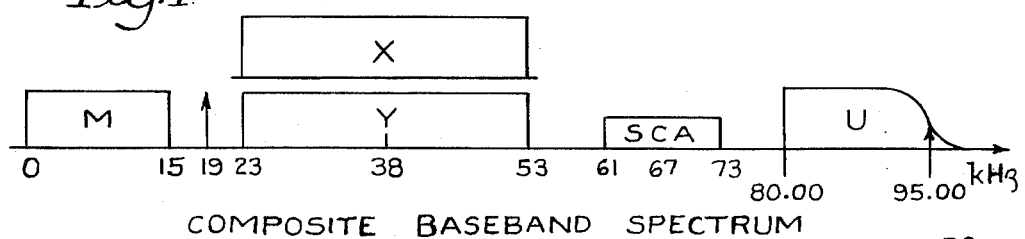
FIG. 1 is a representation of the composite baseband spectrum for a four channel FM stereo system having provision for an SCA channel.

In order to provide additional background for an understanding of quadraphonic FM, as well as to supplement the present disclosure without burdening it with a repetition of the extensive teaching in the Eilers U.S. Pat. No. 3,944,747 the contents of that patent as well as the contents of the Fockens U.S. Pat. No. 3,902,018 and that of the Eilers and de Weger copending applications, as represented by their specifications and drawings, are hereby expressly incorporated into this application.

The four-channel stereo system described by Eilers in connection with FIGS. 1-14 in his U.S. Pat. No. 3,944,747 contemplates the generation and detection of a composite quadraphonic baseband signal comprising a carrier that is frequency-modulated by a main channel, by a pair of double sideband suppressed-carrier amplitude-modulated subcarriers of a radian frequency $\omega_s$, in quadrature, and by a double sideband suppressed-carrier amplitude-modulated subcarrier of radian frequency $\omega_{sv}$ which, in a particular embodiment, equals $2\omega_s$. In such a four-channel stereo systems, in principle, no frequency selective networks are required for the actual decoding process. Either time division multiplexing (TDM) or frequency division multiplexing (FDM) can be employed for generating the composite baseband signal. A type of receiver employed for detecting and reproducing the four-channel composite signal can, of course, utilize either TDM or FDM circuitry but, in either case it is possible to decode the aforementioned composite baseband signal without the use of frequency selective networks. Thus, a decoder for such a system, whether of the FDM or the TDM type or even a combination thereof, can be relatively unsophisticated construction and, by resort to monolithic integrated circuitry, a potentially low priced decoder is readily foreseen.

Another approach to four-channel stereo transmission reception is described in connection with FIGS. 15-22 of the Eilers U.S. Pat. No. 3,944,747. In that system the lower sideband of the second subcarrier $\omega_{sv}$ is suppressed so that only the upper sideband, in substance, is transmitted. The purpose in employing upper single sideband transmission is to accommodate the SCA signal which is conventionally located in that portion of the spectrum which would be occupied by the lower sideband of the second subcarrier $\omega_{sv}$. The SCA signal is a double sideband FM subchannel having its subcarrier normally located at 67kHz and having sidebands bracketing the subcarrier and extending from 61 to 73kHz. Eilers recognized that some of the decoder arrangements, described in his U.S. Pat. No. 3,944,747, would decode the SCA signal as if it were a lower sideband of the second harmonic subcarrier thus causing serious interference. To avoid this interference problem Eilers describes in his U.S. Pat. No. 3,944,747 (text material relating to FIGS. 15-22), either a phasing method or a band stop filter method for decoding.

An approach described and taught by Fockens in his patent, which precludes the demodulating decoder from intermixing the SCA and the upper subchannel, contemplates reversing the spectrum of the upper sideband of the upper subchannel of the Eilers composite baseband signal. Specifically, Fockens resorts to a 95kHz subcarrier to generate the upper subchannel and modulates it lower single sideband suppressed-carrier to produce a spectrum which would be the same as would be occupied by modulating the upper single sideband on a 75kHz subchannel but with the result, of course, that the location of the audio frequencies is now reversed. Thus Fockens discloses a quadraphonic FM system in which an upper subcarrier frequency is selected such that when modulated its lower sideband does not extend into the spectrum space required for SCA service. To that end, an upper subchannel carrier in the order of 95kHz is proposed since it conveniently comprises the fifth harmonic of the 19kHz pilot signal, which signal must be available in order that the quadraphonic system be compatible with the conventional biphonic system. This 95kHz subcarrier is modulated utilizing a lower single sideband method or, as Fockens prefers, a lower vestigial sideband technique.

Figure 5:
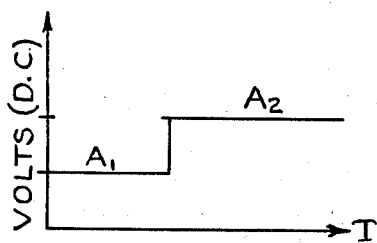
FIG. 5 is graphical depiction of the control signal arrangement for use with the distributors shown in FIG. 4.

Now, the modulation function for the four-channel stereo composite baseband signal, derived in accordance with the teaching of Fockens, can be expressed as follows:

$$f(t) = k[M + Y\sin \omega_s t - X\cos \omega_s t - m U \sin \omega_{sv} t + m \hat{U} G(\omega)\cos\omega_{sv} t] + S \sin \tfrac{1}{2}\omega_s t - T\sin\omega_{sv} t + V\cos \Omega t \quad (2)$$

wherein
  $M = (LF + RF + LB + RB)$ Four-element sum component
  $Y = (LF - RF + LB - RB)$ First difference component
  $X = (LF + RF - LB - RB)$ Second difference component
  $U = (LF - RF - LB + RB)$ Diagonal difference component
  $\hat{U} = (\hat{LF} - \hat{RF} - \hat{LB} + \hat{RB})$, the Hilbert Transform of $U$
  $G(\omega)$ = Auxiliary Transfer Function, which is graphically depicted by FIG. 5 in the Fockens patent
  $LF$ = left-front signal
  $RF$ = right-front signal
  $LB$ = left-back signal
  $RB$ = right-back signal
  $S = 0.1$, the first pilot subcarrier amplitude
  $T = 0.05$, the second pilot subcarrier amplitude
  $V = 0.1$, the SCA subcarrier amplitude at a nominal frequency of 67kHz
  $\omega_s = 2\pi \times 38{,}000$ radians per second
  $\omega_{sv} = 2\pi \times 95{,}000$ radians per second
  $\Omega = 2\pi \times 67{,}000$ radians per second
  $k$ = modulation constant
  $m = 0.7$ A doubly balanced demodulator for use in quadraphonic FM stereo system, that is a system fully compatible with monophonic and biphonic FM transmissions, is described in the aforementioned de Weger application. More particularly, the composite baseband spectrum of such a quadraphonic FM stereo system, which is mathematically stated by Equation (2), is schematically depicted in FIG. 1. As therein illustrated, the sum component M directly frequency modulates a main carrier, the X and Y difference signals amplitude modulate 38kHz quadrature subcarriers respectively, which, in turn, frequency modulate the main carrier, while the U diagonal difference signal lower vestigial sideband modulates a 95kHz subcarrier which, likewise frequency modulates the main carrier.

Figure 2:
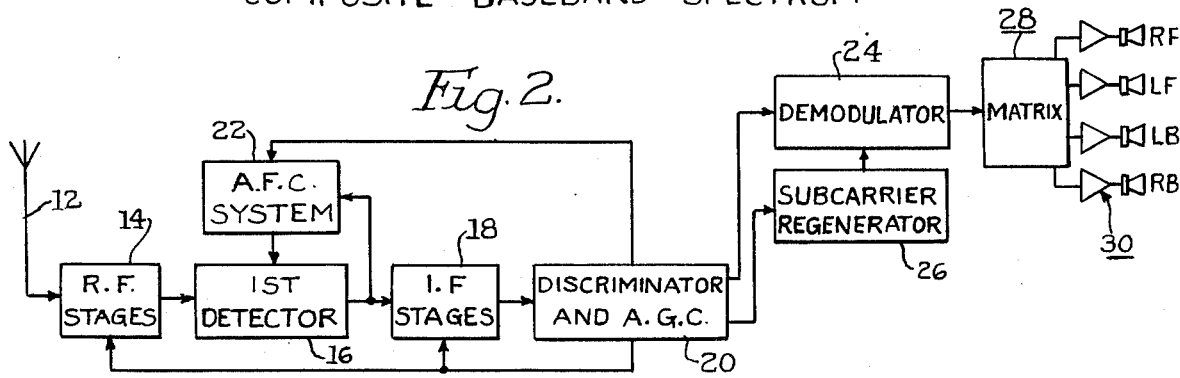
FIG. 2 is a block diagram of a quadrophonic stereo FM receiver capable of retreiving four discrete audio signals from a quadraphonic FM stereo transmission.

FIG. 2 shows, in block diagram form, a quadraphonic FM receiver in which such a doubly balanced demodulator finds particular application. Insofar as that receiver is concerned, suffice it to say that a transmitted quadraphonic FM stereo signal, intercepted by the antenna 12, is translated by one or more radio frequency (RF) stages 14 to a first detector 16. This detector serves to convert the incoming RF signal to an intermediate frequency (IF) which is translated by IF stages 18 to a discriminator and automatic gain control (AGC) network 20. In a conventional manner the AGC portion of stage 20 is utilized to develop a control signal which is fed back to govern the gain of the RF stages and the IF stage to insure application of a constant amplitude signal to the discriminator. Similarly, an AFC system 22 is provided to control the frequency of the local oscillator. To this end the AFC system, in response to signals from the local oscillator of detector 16 and from the discriminator 20, derives a control signal which adjusts the frequency of the oscillator so as to accurately set the response of the detector relative to the frequency of the received broadcast signal.

When receiving a quadraphonic stereo broadcast, the composite baseband signal available at the output of the discriminator 20 is that defined by the demodulation function of Equation (2), which, as indicated, includes a 19kHz pilot signal. This composite signal is applied to a signal processing stage, or demodulator 24, while the pilot signal is applied to a subcarrier regenerator 26 which serves to derive a 38kHz in-phase subcarrier signal, a 38kHz quadrature subcarrier signal and a 95kHz subcarrier signal. These subcarriers are applied as switching signals to appropriate signal processing circuits in stage 24 to effect a synchronous demodulation of the composite baseband signal. As a result, the output of stage 24 comprises a $-M$ sum component, $\pm X$ and $\pm Y$ difference components and $\pm U$ diagonal difference components. These components are applied to a passive matrix 28 which, in turn, derives four discrete audio signals RF, LF, LB and RB for application, through individually assigned units of the amplifier bank 30, to like designated speakers. This derivation obtains by virtue of the addition and subtraction, within matrix 28, of the sum and audio difference components. As shown in the de Weger application, matrix 28 may constitute four conductors to which the indicated combinations of sum, difference and diagonal audio difference components are applied.

Figure 3:
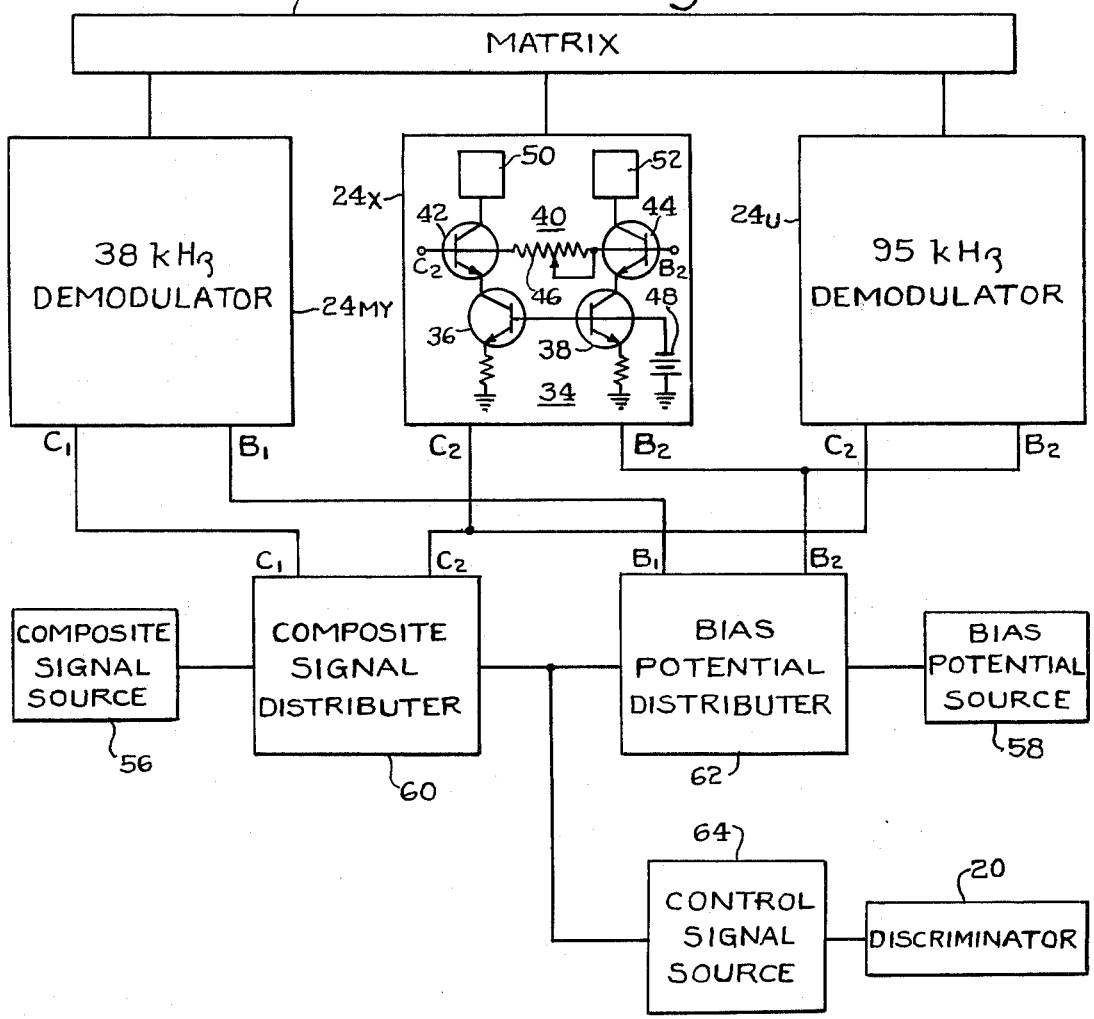
FIG. 3 is a block diagram of a composite signal distributing and muting system for use in the FM receiver of FIG. 2.

Turning now to a consideration of a signal distributing and muting system for the subject quadraphonic receiver, attention is directed to FIG. 3 wherein the signal processor of FIG. 2 is depicted as a plurality of units. Specifically, stage 24 is seen to comprise first, second and third demodulators which are designated $24_{MY}$, $24_X$ and $24_U$, respectively. Demodulator $24_{MY}$ comprises a signal processor which, in response to a 38kHz inphase subcarrier signal from regenerator 26, derives a $-M$ four-element sum component, as well as $\pm Y$ difference components. Demodulator $24_X$, in response to a 38kHz quadrature drive signal, serves to develop $\pm X$ difference components. Finally, demodulator $24_U$, in response to a b 95kHz subcarrier signal, derives $\pm U$ difference components.

Insofar as operation of the receiver of FIG. 2 is concerned, when it is in receipt of a monaural FM transmission, only signal processor $24_{MY}$ is required to be functional since only the M or sum signal is required to reproduce the transmitted program. When the receiver responds to a biphonic FM transmission, again, only signal processor $24_{MY}$ is required to be operative since the M sum signal and the Y (L−R) component suffice to reproduce a stereo program. On the other hand, when a four-channel transmission is received, in addition to signal processor $24_{MY}$, processors $24_X$ and $24_U$ are now required to reproduce the performance. In the receiver of FIG. 2, as disclosed by de Weger, each of demodulators $24_X$ and $24_U$ preferably comprises a doubly balanced differential amplifier circuit. A schematic representation of a portion of such a differential amplifier circuit is disclosed in connection with demodulator $24_X$ in FIG. 3.

In that regard, demodulator $24_X$ is seen to comprise a constant current source 34 which includes a pair of active devices, specifically the transistors 36, 38. This demodulator further includes a differential amplifier 40 which includes the transistors 42, 44. A composite baseband signal $C_2$ is applied to the base electrode of transistor 42 via a signal distributing and muting system to be described below. A bias potential $B_2$, also derived from the aforesaid signal distributing system, is applied to the base electrode of transistor 44. The emitters of differential amplifier transistors 42, 44 are intercoupled by an adjustable resistor 46 and are also connected to the collectors of the constant current transistors 36, 38. The bases of the constant current source transistors are returned to a source of regulated DC voltage, represented by the battery 48, which serves to establish a forward bias across the base-emitter junctions of those transistors. Finally, included in the output circuit of differential amplifier 40 is a pair of switches 50, 52 each of which comprises a plurality of current-splitting transistors. The details of these switches, as well as the manner in which they function to derive ±X difference signal components are fully described in the previously mentioned de Weger application; accordingly, no further discussion here is deemed necessary.

In practice, demodulator 24 is incorporated in an integrated circuit chip so that, in addition to the previously described signal processing circuits, such a chip may also support the signal distributing and muting system for the receiver. In any event, and in accordance with the invention, in addition to the aforesaid signal processing circuits, the signal distributing and muting system for a multiple-channel stereo receiver comprises a source of composite baseband signal 56 (in practice, the discriminator), a temperature compensated bias potential source 58, a composite signal distributor 60 and a bias potential distributor 62. The composite signal distributor has an input terminal coupled via a DC blocking capacitor to the composite signal source 56, a first output terminal for applying a composite signal $C_1$ to one of the signal processors, specifically to demodulator $24_{MY}$, and a second output terminal for applying a composite signal $C_2$ to the input terminals of the other signal processors, namely, demodulators $24_X$ and $24_U$. The bias potential distributor 62 has an input terminal connected to bias source 58, a first output terminal for applying operating bias $B_1$ to demodulator $24_{MY}$ and a second output terminal for applying operating bias $B_2$ to demodulators $24_X$ and $24_U$.

The signal distributing and muting system further includes a source of control signal 64, which signal has a predetermined first amplitude indicative of detection by the receiver of a multiple-channel related pilot signal and has a predetermined different amplitude indicative of failure of the receiver to detect such a pilot signal. FIG. $4_B$ graphically depicts this control signal and its predetermined amplitudes.

A switch means, associated with the composite signal distributor 60 and bias potential distributor 62, and described in greater detail below, responds to a control signal of the aforesaid predetermined first amplitude to establish a coupling between the second output terminals of distributors 60 and 62 and demodulator $24_X$ and $24_U$ to render these demodulators operative. On the other hand, and in response to a control signal of the previously defined predetermined different amplitude, the switch means renders demodulators $24_X$ and $24_U$ quiescent by effectively decoupling composite signal $C_2$ from those demodulators. Simultaneously, this switching action attains a silent muting of the receiver by so controlling the bias potentials $B_2$ applied concurrently to the differential amplifiers of demodulators $24_X$ and $24_U$ that the power consumed by these differential amplifiers during the quiescent condition remains substantially the same as the power consumed by them during their operative condition.

Figure 4:
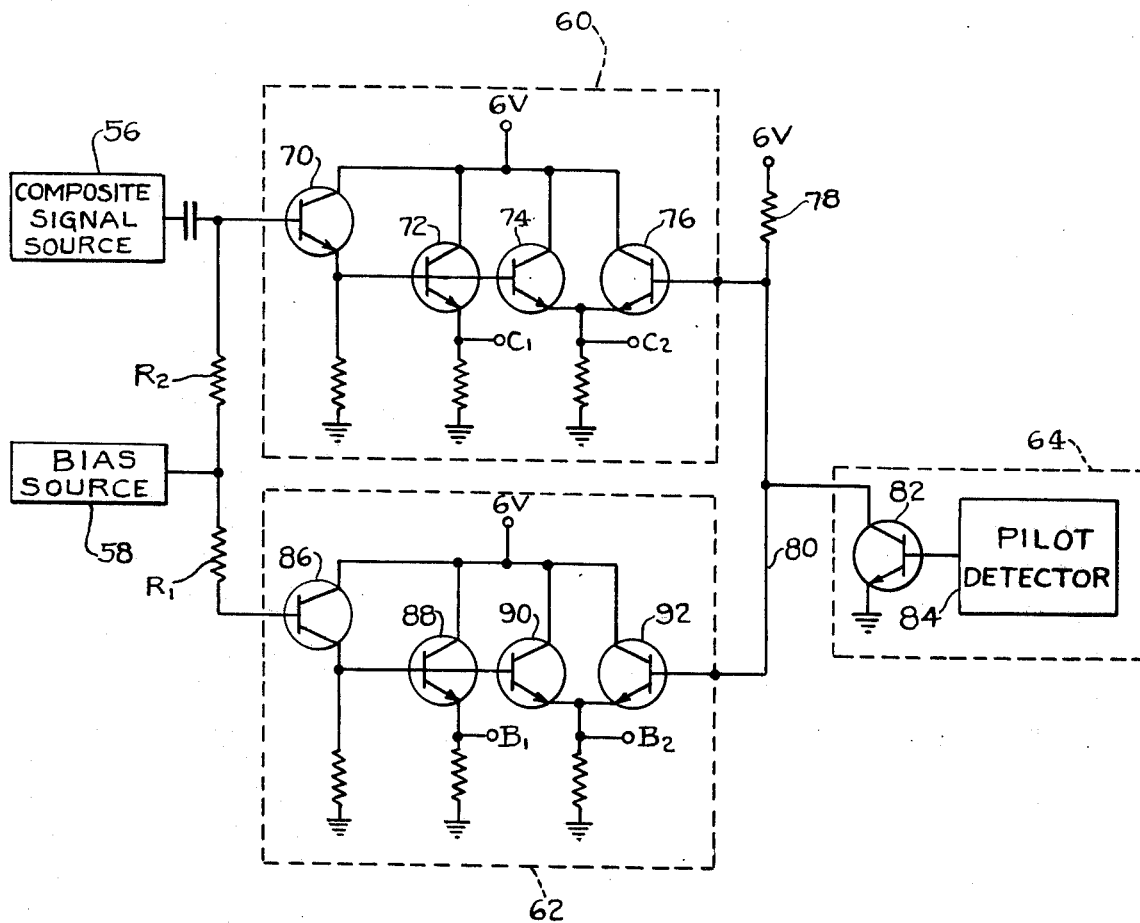
FIG. 4 is a schematic diagram of the composite signal distributor and the bias potential distributor employed in the system shown in FIG. 3.

Turning now to FIG. 4 and thus to a more detailed consideration of the composite signal and bias potential distributors, composite distributor 60 is seen to comprise an input transistor amplifier 70 having a base electrode which is driven by a composite baseband signal capacity coupled thereto from signal source 56. The emitter of transistor 70, which is returned to reference potential through a resistor, is directly coupled to the base electrodes of a pair of parallel connected output transistors 72, 74. The emitter electrodes of transistors 72, 74 are returned, individually, to reference potential through resistive impedances. The junction of these emitters and their associated resistors constitute the output terminals of transistors 72, 74 from which composite signals $C_1$ and $C_2$ are made available to demodulator $24_{MY}$ and to demodulators $24_X$ and $24_U$, respectively. As shown, the collectors of transistors 70, 72 and 74 are returned to a source of positive potential.

Coupled across the output of transistor 74 is an active switch element of the previously mentioned switch means, which element can take the form of a transistor 76 having its emitter and collector electrodes connected in parallel with the emitter and collector electrodes of output transistor 74. The base of switching transistor 76 is connected via a resistor 78 to a source of positive potential and via conductor 80 to the source of control signal 64. More particularly, conductor 80 is returned to the collector of a gating transistor 82 which comprises the output circuit of a b 95kHz pilot detector 84. This detector responds to the 95kHz pilot component of the composite baseband signal derived by discriminator 20. In practice, pilot detector 84 and control transistor 82 are also incorporated in the integrated circuit chip embodying demodulator 24.

Briefly, insofar as the operation of the control signal source is concerned, suffice it to say that when a composite baseband signal derived by discriminator 20 includes a 95kHz pilot signal, indicative of reception by the receiver of a four-channel transmission, detector 84 derives and applies a signal to the base of gating transistor 82 rendering that transistor conductive. This course of action, in turn, causes a control signal of a predetermined amplitude $A_1$ to appear at the collector of transistor 82. On the other hand, in the absence of a four-channel transmission, pilot detector 84 will fail to derive a signal for application to the base of transistor 82. This gating transistor is then cut-off allowing its collector to rise toward its energizing potential, i.e., 6 volts. The control signal now appearing on the collector of transistor 82 has a predetermined different (and higher) amplitude $A_2$ which is indicative of a failure on the part of detector 86 to detect a 95kHz pilot.

Insofar as the bias potential distributor 62 is concerned, its construction is substantially identical to that of the composite signal distributor 60. To that end, distributor 62 also comprises an input transistor amplifier 86 having a base electrode connected through a resistor $R_1$ to the source of compensated bias potential 58. Note that bias source 58 also supplies, through a matching resistor $R_2$ ($R_2=R_1$), an identical DC bias to the base of input transistor 70 of the composite signal distributor. This arrangement is employed to assure balanced operation as respects the transistor pair of each demodulator differential amplifier. In this regard, and with reference to FIG. 3, it is seen that, through the application of composite signal $C_2$ to the base of transistor 42 and bias potential $B_2$ to the base of transistor 44, identical DC potentials are applied to those bases.

The emitter of transistor 86 is coupled to reference potential through a resistor and is also connected to the base electrode of a pair of parallel connected output transistors 88, 90. The emitter electrodes of transistors 88, 90 are returned, individually, to reference potential through assigned resistors. The junction of these emitters and their associated resistors constitute the output terminals for transistors 88, 90 from which bias potentials $B_1$ and $B_2$ are derived for application to demodulator $24_{MY}$ and, to demodulators $24_X$ and $24_U$, respectively. As in composite signal distributor 60, the collectors of transistors 86, 88 and 90 are returned to a source of positive potential.

The previously mentioned switch means is also coupled across the output of transistor 90. In this case, the switch means comprises the active element 92, which also takes the form of a transistor, having its emitter and collector electrodes connected in parallel with the emitter and collector electrodes of transistor 90. The base of switching transistor 92 is connected via resistor 78 to a 6 volt source of positive potential and, via conductor 80, to the collector of the control transistor 82 of the pilot detector 84.

The operation of the composite signal distributor and the bias potential distributor will now be described. As previously noted, when the receiver of FIG. 2 responds to a four-channel transmission, the output of discriminator 20 comprises the composite baseband signal depicted in FIG. 1. This composite baseband signal is simultaneously applied to the composite signal distributor 60 and to the control signal source 64. As shown in FIG. 4, the composite baseband signal is applied through a DC blocking capacitor to the base of input transistor 70 of distributor 60. The function of the capacitor, of course, is to prevent DC bias signal from source 58 from being applied to the composite signal source 56. Note further that DC bias from source 58 is also applied to the base of transistor 70. Input transistor 70, which functions as an emitter follower amplifier, applies the signal developed across its emitter resistor simultaneously to the bases of output transistors 72 and 74. Identical versions of the composite signal are developed across the emitter resistors of transistors 72 and 74, which signals are designated $C_1$ and $C_2$. As depicted in FIG. 3, composite baseband signal $C_1$ is applied only to the 38kHz demodulator $24_{MY}$ while composite baseband signal $C_2$ is applied simultaneously to the 38kHz quadrature demodulator $24_X$ and the 95kHz demodulator $24_U$.

Turning now to the operation of bias potential distributor 62, it is noted that a DC bias potential from source 58 is applied to the base of input transistor 86. This transistor also functions as an emitter follower amplifier and, to that end, applies the signal developed across its emitter resistor simultaneously to the bases of transistors 88 and 90. These transistors also function as emitter follower amplifer to develop output signals across their respective emitter resistors, which outputs are designated $B_1$ and $B_2$. Turning again to FIG. 3, it is noted that bias potential $B_1$ is applied only to the 38kHz demodulator $24_{MY}$ while bias potential $B_2$ is applied simultaneously to demodulator $24_X$ and demodulator $24_U$.

It has been assumed that, during the course of the foregoing, the receiver was in receipt of a four-channel transmission. In that situation, the composite baseband signal output from discriminator 20 is simultaneously applied to the control signal source 64 permitting pilot detector 84 to, in response to the 95kHz pilot, derive and apply a gating signal to the base of transistor 82. In response to the gating signal, transistor 82 is rendered conductive which state causes a control signal of a predetermined first amplitude $A_1$ to appear in the collector circuit of transistor 82. Control signal $A_1$ is applied simultaneously to the bases of the switching transistors 76 and 92 individually included in composite signal distributor 60 and bias potential distributor 62, respectively. The amplitude of control signal $A_1$ is insufficient to render either of these switching transistors conductive so they remain open and thus have no influence upon the signals $C_2$ and $B_2$ developed in the emitter circuits of transistors 74 and 90. Accordingly, in the presence of a four-channel signal, the pilot detector responds to the 95kHz pilot and derives therefrom a control signal which maintains a coupling between the output terminals of transistors 74 and 90 and demodulators $24_X$ and $24_U$ to render these demodulators operative.

On the other hand, in the absence of a four-channel transmission or, in the absence of the 95kHz pilot, detector 84 fails to develop a signal for application to the base of gating transistor 82. This transistor is then cut-off so that a control signal of a predetermined different amplitude $A_2$ is caused to appear in the collector circuit. Specifically, this control signal contitutes the collector voltage which now rises toward the 6 volt energizing potential. This switching signal $A_2$ is applied simultaneously to the bases of switch transistors 76 and 92 to forward bias them. With the base-emitter junctions of transistors 76 and 92 thus forward biased, the collector current increases substantially causing the voltage across the emitter resistors of these transistors to rise correspondingly. This rise in emitter potential serves to cut-off output transistors 74 and 90 so that composite signal is not translated by those transistors. This action effectively decouples composite signal $C_2$ from demodulators $24_X$ and $24_U$ thereby rendering them quiescent or non-functional.

Simultaneously, the bias potentials applied concurrently to the differential amplifiers of demodulators $24_X$ and $24_U$ are so controlled that the power consumed by the differential amplifier transistors during this quiescent condition remains substantially the same as the power consumed by them during their operative condition.

This situation obtains by virtue of the fact that the operation of the differential amplifiers of modulators $24_X$ and $24_U$ remains balanced. For example, in the subject situation where output transistors 74 and 90 have been cut off, the DC potentials across the emitter electrodes of those transistors remain identical, as a result, identical DC biases are applied to the bases of differntial amplifier transistors 42, 44. Although the DC bias on the bases of transistors 42, 44 is now higher than the bias applied when output transistors 74 and 90 are conducting the total current through differential amplifier transistors 42 and 44 remains the same because of the control effect exerted by the constant current source 34. Accordingly, irrespective of whether demodulators $24_X$ and $24_U$ are operative (functional) or quiescent (nonfunctional) the power consumed by them always remains the same.

In conclusion, an improved signal distributing and muting system for a four-channel FM stereo receiver has been described which affords not only silent muting of the receiver, in the absence of a four-channel signal, but also precludes a deterioration of channel separation on two-channel programs. This improvement is achieved by (1) decoupling the composite baseband signal from the nonfunctional ones of the receivers demodulators in the absence of a 95kHz pilot and (2) by arranging the biasing system so that, at any point in time, the bias potentials applied to a demodulator differential amplifier transistor pair are identical irrespective of whether the demodulator is operative (functional) or quiescent (non-functional). Moreover, the subject improvement is achieved while maintaining power consumption by the demodulator differential amplifiers substantially constant during quiescent and operative conditions thus further contributing to operational stability.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. A signal distributing and muting system for a multiple-channel stereo receiver comprising:
    a source of composite baseband signal;
    a source of bias potential;
    a plurality of demodulators responsive to said composite baseband signal and to said source of bias potential for developing a like plurality of audio difference components, each of said demodulators comprising a differential amplifier;
    a composite signal distributor having an input terminal coupled to said source of composite baseband signal,
        a first output terminal for applying said composite signal to one of said demodulators, and
        a second output terminal for applying said composite signal to the other ones of said demodulators;
    a bias potential distributor connected to said source of bias potential and having a first output terminal for applying operating bias potential to said one demodulator and
        a second output terminal for applying operating bias potential to said other ones of said demodulators;
    a source of control signal, said control signal having a predetermined first amplitude indicative of detection by said receiver of a multiple-channel related pilot signal and having a predetermined different amplitude indicative of failure to detect such pilot signal; and
    switch means coupled to said second output terminals of said composite signal distributor and said bias potential distributor and responsive to a control signal of said predetermined first amplitude to maintain a coupling between said second output terminals and said other demodulators to render said other demodulators operative
    and responsive to a control signal of said predetermined different amplitude to render said other demodulators quiescent by effectively decoupling said composite signal from said other demodulators while simultaneously controlling the bias potentials applied concurrently to each of said other demodulator differential amplifiers so that the power consumed by said other demodulator differential amplifiers during said quiescent condition remains substantially the same as the power consumed by them during their operative condition.

2. A signal distributing and muting system as set forth in claim 1 in which said composite signal distributor and said bias potential distributor comprise substantially identical amplifiers.

3. A signal distributing and muting system as set forth in claim 1 in which said other demodulators comprise substantially identical differential amplifier circuits.

4. A signal distributing and muting system as set forth in claim 1 in which said switch means includes a gating transistor coupled across said second output terminals of said composite signal distributor and of said bias potential distributor.

5. A signal distributing and muting system as set forth in claim 1 in which the DC output signal appearing at the second output terminal of said composite signal distributor follows substantially the DC signal output appearing at the second output terminal of said bias potential distributor when said switch means renders said other demodulators quiescent.

* * * * *